United States Patent
Aipperspach et al.

(12)

(10) Patent No.: US 6,275,427 B1
(45) Date of Patent: Aug. 14, 2001

(54) STABILITY TEST FOR SILICON ON INSULATOR SRAM MEMORY CELLS UTILIZING DISTURB OPERATIONS TO STRESS MEMORY CELLS UNDER TEST

(75) Inventors: Anthony Gus Aipperspach; Todd Alan Christensen; Douglas Michael Dewanz, all of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/552,119

(22) Filed: Apr. 19, 2000

(51) Int. Cl.[7] .................................................. G11C 7/00
(52) U.S. Cl. ........................................ 365/201; 365/189.01
(58) Field of Search ................................... 365/201, 156, 365/230.01, 189.09

(56) References Cited

U.S. PATENT DOCUMENTS 6,128,219 * 10/2000 Pio et al. .............................. 365/201

* cited by examiner

Primary Examiner—Terrell W. Fears
(74) Attorney, Agent, or Firm—Wood, Herron & Evans; Scott A. Stinebruner

(57) ABSTRACT

An apparatus, program product, and method of testing a silicon-on-insulator (SOI) static random access memory (SRAM) introduce switching history effects to a memory cell under test to stress the memory cell such that a reliable determination of stability may be made. It has been found that the worst case scenario for memory cell stability typically occurs immediately after a memory cell is switched to one state after the memory cell has been maintained in the other, opposite state for a period of time sufficient to introduce switching history effects. As such, a testing process may be configured to maintain a memory cell in a particular state for a period of time sufficient to introduce switching history effects, whereby the memory cell may be adequately stressed during the testing process to highlight any stability problems by setting the memory cell to an opposite state, and then shortly thereafter disturbing the memory cell, e.g., via a read to the memory cell or another memory cell on the same column or row of a memory array.

30 Claims, 3 Drawing Sheets

STABILITY TEST FOR SILICON ON INSULATOR SRAM MEMORY CELLS UTILIZING DISTURB OPERATIONS TO STRESS MEMORY CELLS UNDER TEST

CROSS-REFERENCE TO RELATED APPLICATIONS

This application is related to U.S. patent application Ser. No. 09/552,410, filed on even date herewith by Aipperspach et al., and entitled "Stability Test for Silicon on Insulator SRAM Memory Cells Utilizing Bitline Precharge Stress Operations to Stress Memory Cells Under Test", which application is incorporated by reference herein.

FIELD OF THE INVENTION

The invention is generally related to testing solid-state memories, and in particular, to stability testing of silicon on insulator static random access memory cells and memory arrays incorporating the same.

BACKGROUND OF THE INVENTION

Solid-state memories, i.e., memories formed from arrays of memory cells disposed on integrated circuits, or chips, are utilized in a wide variety of applications to store data in computers and other electronic devices. One type of solid-state memory, for example, is static random access memory (SRAM), which due to its fast access time is often used in high performance applications such as cache memories coupled to computer processors. Often, SRAM memory arrays are embedded—that is, integrated with a computer processor and/or other logic on a single chip.

Due to processing variations during the manufacture of chips incorporating SRAM's or other solid-state memories, memory testing is often required during manufacture of the chips to identify defective chips that fall outside of desirable performance specifications. It is also often desirable to provide memory testing capabilities in electronic devices that incorporate such chips, e.g., using embedded built-in self-test (BIST) logic, to detect defects that may arise after manufacture and thereby ensure the continued reliability of data stored in the chips.

A number of performance characteristics are desirable for SRAM and other types of memory arrays. One such performance characteristic is stability, which generally refers to the ability of a memory cell in a memory array to maintain a given logic state after that logic state is written into the memory cell. Stability is often a critical performance metric for a memory cell, as an unstable memory cell may be susceptible to unexpectedly flipping logic states in certain circumstances, and thereby corrupting the data stored in the cell.

To provide a better understanding of the concept of stability, FIG. 1 illustrates a conventional SRAM memory cell 10 coupled between a wordline WL and pair of complementary bitlines BLC and BLT. Multiple wordlines and bitline pairs are typically provided in a memory array such that each memory cell in the array is coupled to a unique combination of wordlines and bitline pairs to permit each memory cell to be individually accessed in the array.

A conventional SRAM memory cell typically includes six metal oxide semiconductor field effect transistors (MOSFET's, or simply FET's), which are illustrated in FIG. 1 as FET's N1–N4 and P3–P4. FET's N1 and N2 are n-type MOSFET's that function as pass gates controlled by wordline WL. FET's N3 and P3 are respectively n-type and p-type FET's arranged to form an inverter, as are FET's N4 and P4. The inverters N3/P3 and N4/P4 are arranged in a cross-coupled configuration, with the output of one inverter coupled to the input of the other. Pass gate FET's N1 and N2 respectively couple the cross-coupled inverters to the BLC and BLT bitlines in response to the signal on wordline WL.

As shown in FIG. 2, data is written into an SRAM memory cell by precharging bitlines BLT, BLC to a predetermined level such as the high supply, turning off the bitline precharge devices, activating pass gates N1 and N2 by asserting wordline WL, and subsequently driving bitlines BLT and BLC to force the desired data on the bitlines. Subsequent to these operations, the internal nodes of the memory cell, illustrated at TRU and CMP (for "true" and "complementary" states) are switched to represent the appropriate state being written to the cell (e.g., a transition from a logic "1" to a logic "0" state in FIG. 2). Once the internal nodes have been switched to the proper state, pass gates N1 and N2 are shut off by deasserting wordline WL, and the bitline precharge devices are turned on to precharge the bitlines BLT and BLC to the high supply. The WRITE operation is then complete.

As shown in FIG. 3, a READ operation occurs by precharging bitlines BLT, BLC to the high supply, turning off the bitline precharge devices, activating pass gates N1 and N2 by asserting wordline WL, and then allowing the appropriate true or complement bitline BLT, BLC to be discharged depending upon the data stored in the cell (e.g., for FIG. 3, where a logic "1" state is stored in the cell, the BLC line is discharged). The state of the memory cell is then sensed by a sense amplifier coupled to the bitlines, and after sensing of the data, pass gates N1 and N2 are shut off by deasserting wordline WL, and the bitline precharge devices are again turned on to precharge the bitlines to the high supply.

Stability concerns arise in SRAM memory cells due to the relatively large capacitance of the bitlines BLT and BLC relative to the FET's in such memory cells. In particular, absent proper design and manufacture, the capacitance in the bitlines can flood from the bitlines during accesses to a memory array to switch the internal state of a memory cell, resulting in instability and unreliability of data. As shown in FIG. 3, for example, any attempt to read memory cell 10, or even any other memory cell controlled by the same wordline, results in the level at the CMP internal node rising from its zero logic state. If the CMP node rises high enough to activate the N3/P3 inverter, the cell will switch state, and thereby corrupt the data stored in the cell.

To address this difficulty, the relative sizes of pass gates N1 and N2 are typically designed relative to the pull down FET's N3 and N4 in the cross-coupled inverters to prevent charge from the bitlines from switching the internal state of the cell. However, it has been found that variations in cell widths, lengths, threshold voltages, and other manufacturing parameters can still cause instability in a memory cell, and thus memory testing is often required to ensure that manufactured components meet acceptable stability parameters.

Furthermore, certain fabrication technologies can be more susceptible to stability concerns than others. In particular, it has been found that SRAM's manufactured using silicon-on-insulator (SOI) technology may exhibit additional characteristics that impact memory stability beyond conventional bulk silicon technologies. With a conventional bulk silicon process, for example, SRAM memory cells are formed on a silicon substrate, which is typically tied to a fixed voltage level such as ground or high supply so that the bodies of the FET's are maintained at a fixed potential. With SOI technology, on the other hand, FET's are formed within an oxidized layer of insulation on a substrate that insulates the FET's from electrical effects, and permits the FET's to operate at a higher speed and with reduced power consumption. As a result, the bodies of the FET's are not tied to any fixed potential, and are thus allowed to "float" to different voltages based upon their respective switching histories.

As the body voltage of a FET changes, its characteristics, e.g., the threshold voltage required to activate the FET, also change. As such, it has been found that the switching history effect exhibited by SOI SRAM's may result in memory cells favoring one state over the other, with such favoritism typically increasing over time as a cell is maintained in the same state.

For example, FIG. 3 illustrates how the amount in which the complementary node CMP rises during a READ operation can vary depending upon switching history. In many instances, it has been found that the level in which the complementary node will rise in response to a READ operation is at a relatively low level, e.g., as represented at A in FIG. 3. However, it has also been found that, when a cell has remained in one state for a relatively long time, and thus favors that state, the cell typically has its greatest instability immediately after it is written to an opposite state, such that any READ to the memory cell or any other memory cell on the same wordline may cause the CMP node of such memory cell to rise even higher (e.g., as represented at B in FIG. 3) —potentially to a level that would switch the internal state of the memory cell.

Given that switching history does not appreciably modify the performance of memory cells formed using conventional bulk silicon processes (principally due to the fixed body potentials in the cells), conventional memory tests for bulk silicon processes do not address or accommodate for switching history effects. Accordingly, conventional memory tests are often incapable of adequately testing the potential reliability of SOI SRAM memory arrays.

Therefore, a significant need has arisen in the art for a manner of testing SOI SRAM memory cells and arrays incorporating the same so as to accommodate for switching history effects in a determination of the stability of such cells.

SUMMARY OF THE INVENTION

The invention addresses these and other problems associated with the prior art by providing an apparatus, program product, and method of testing a silicon-on-insulator (SOI) static random access memory (SRAM) in which switching history effects are introduced to a memory cell during testing to stress the memory cell such that a reliable determination of stability may be made. In particular, it has been found that the worst case scenario for memory cell stability typically occurs immediately after a memory cell is switched to one state after the memory cell has been maintained in the other, opposite state for a period of time sufficient to introduce switching history effects. As such, by configuring a testing process to maintain a memory cell in a particular state for a period of time sufficient to introduce switching history effects, the memory cell can be adequately stressed during the testing process to highlight any stability problems by setting the memory cell to an opposite state, and then shortly thereafter disturbing the memory cell, e.g., via a read to the memory cell or another memory cell on the same column or row of a memory array.

In some embodiments of the invention, sufficient stress may be applied to memory cells in a memory array by initializing the memory cells to a first state, and then accessing the memory cells in a predetermined sequence, with each access to a memory cell including setting the memory cell to a second state, and disturbing the memory cell after setting the memory cell to the second state. Thereafter, the current state of each memory cell may be determined to confirm whether the memory cell is still in the second state.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 4:
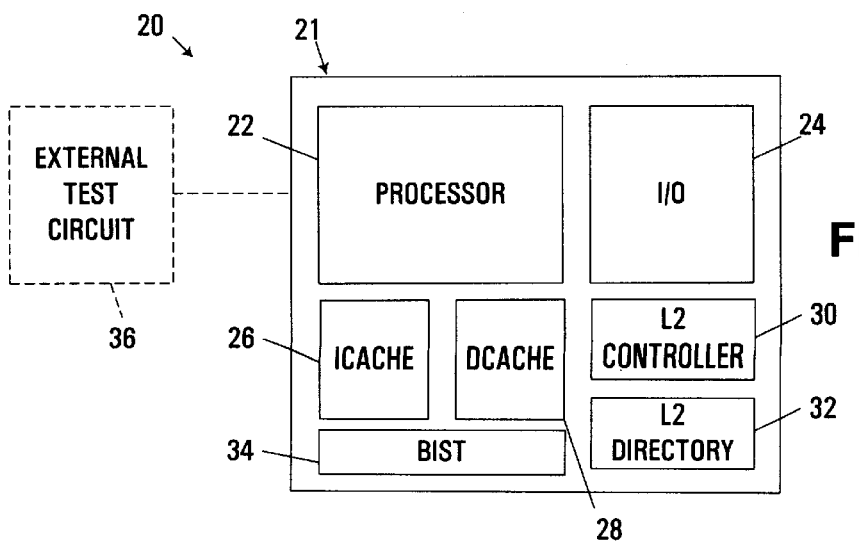
FIG. 4 is a block diagram of an apparatus incorporating memory test logic for performing stability testing consistent with the invention.

Turning to the drawings, wherein like numbers denote like parts throughout the several views, FIG. 4 illustrates an apparatus 20 suitable for performing stability testing of an SOI SRAM memory array consistent with the invention. In this implementation, stability testing of one or more embedded SRAM memory arrays in a microprocessor integrated circuit device, or chip, 21 is shown. In particular, chip 21 is shown including a processor core 22, an input/output (I/O) interface block 24, an L1 cache partitioned into an instruction cache 26 and a data cache 28, and an integrated L2 cache controller 30 and L2 directory 32, suitable for interface with one or more external memory chips to provide the data storage for the L2 cache. It is anticipated that SRAM memory arrays may be disposed in any or all of instruction cache 26 (e.g., in a data array and/or a directory array), data cache 28 (e.g., in a data array and/or a directory array), or L2 directory 32. Moreover, it is anticipated that chip 21 is fabricated using an SOI-based fabrication process known in the art.

Stability testing may be performed for any or all of the SRAM memory arrays in chip 21 using test logic disposed either on-board chip 21, e.g., using built-in self-test (BIST) logic 34, or external to chip 21, e.g., using an external test circuit 36. BIST logic 34 handles testing of all arrays on chip 21, e.g., those within caches 26 and 28 and L2 directory 32. In other embodiments, dedicated BIST logic may be incorporated into any of the functional memories on chip 21 to handle testing of just those functional memories. Furthermore, stability test operations may be initiated or performed in whole or in part by processor core 22.

Moreover, it is anticipated that stability testing may be performed during manufacture of chip 21 and/or during use of the chip, e.g., during power-on BIST occurring during a hard or soft reset of chip 21. Testing during manufacture may be performed solely in an external test circuit, i.e., without any on-board logic, or in the alternative, testing logic may be disposed on-board chip 21 to perform the testing operations and report results to the external test circuit. It will be appreciated that different testing platforms and protocols may be utilized consistent with the invention, so the invention is not limited to the particular implementation discussed herein.

Stability testing consistent with the invention typically incorporates a testing algorithm implemented in either software and/or hardware disposed in chip 21 and/or external test circuit 36. Implementation of all or part of such algorithm in software typically incorporates one or more programs comprising one or more instructions that are resident at various times in various memory and storage devices in a computer or other programmable electronic device, and that, when read and executed cause such computer or programmable electronic device to perform the steps necessary to execute steps or elements embodying the various aspects of the invention. Implementation of all or part of such algorithm in hardware typically incorporates hardwired logic and/or executable firmware defined within a circuit arrangement disposed on an integrated circuit device. While the invention has and hereinafter will be described in the context of fully functioning computers and computer systems, and/or fully functioning integrated circuit devices, those skilled in the art will appreciate that the various embodiments of the invention are capable of being distributed as a program product in a variety of forms, and that the invention applies equally regardless of the particular type of signal bearing media used to actually carry out the distribution. For software-based implementations, a program product may comprise source or executable program code. For hardware-based implementations, computer data files, referred to herein as hardware definition programs, may be used to define the layout of the circuit arrangement utilized to implement stability testing consistent with the invention. Examples of signal bearing media include but are not limited to recordable type media such as volatile and nonvolatile memory devices, floppy and other removable disks, hard disk drives, optical disks (e.g., CD-ROM's, DVD's, etc.), among others, and transmission type media such as digital and analog communication links.

For the sake of simplicity, the discussion hereinafter will focus on an exemplary implementation of the invention in performing a BIST-implemented stability test on an embedded memory arrays on chip 21, e.g., using BIST engine 34. However, the invention may be utilized in any other environment where it is desirable to test one or more SRAM memory cells fabricated using SOI technology. Therefore, the invention is not limited to the particular implementation disclosed herein.

Figure 5:
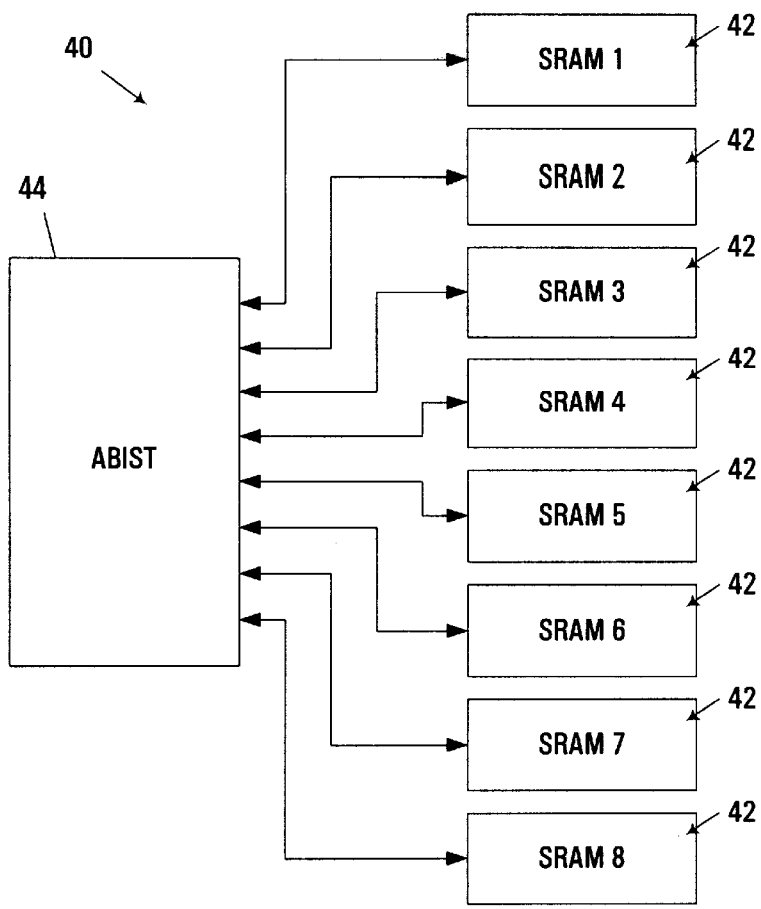
FIG. 5 is a block diagram of an embedded test logic implementation suitable for performing stability testing in the apparatus of FIG. 4.

FIG. 5 illustrates, for example, a test apparatus 40 including a plurality of SRAM blocks 42 coupled to an array built-in self-test (ABIST) engine 44. As is well known in the art, typically a memory such as a cache memory is implemented using multiple instances of a logical subarray block, with each instance providing one bit among a plurality of bits assigned to a particular memory address. Each SRAM block 42 may therefore represent an entire memory array, or only a portion of a memory array. Only eight SRAM blocks 42 are illustrated in FIG. 5; however, it will be appreciated that any number of SRAM blocks 42 may be utilized to implement the various memory arrays embedded on chip 21.

In the illustrated implementation, ABIST engine 44 is coupled to each SRAM block 42 through a serial scan path interface, where data is scanned through a chain of scan registers in each SRAM block 42 in a manner well known in the art. In the alternative, other interfaces, e.g., parallel interfaces, may be utilized in the alternative.

Figure 6:
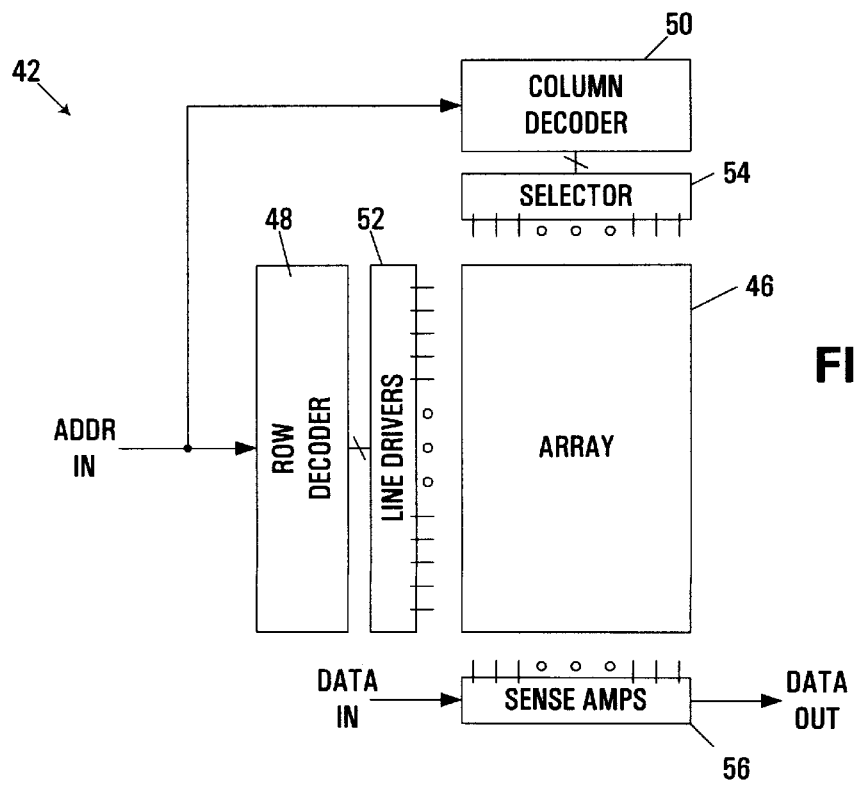
FIG. 6 is a block diagram of one of the SRAM memory blocks of FIG. 5.

FIG. 6 illustrates one of SRAM blocks 42 in greater detail, including a memory array 46 including a plurality of memory cells arranged into a plurality of rows and columns. A plurality of wordlines and a plurality of bitline pairs (not shown in FIG. 6) permit access to the plurality of memory cells in array 46. An incoming address, e.g., as provided by an address bus or by ABIST engine 44 (FIG. 5), is forwarded to a row decoder 48 and a column decoder 50 to decode a corresponding row and column for the address in a manner well known in the art. The row decoder drives one of a plurality of line drivers 52 based upon the decoded row from the memory address, with the line drivers coupled to the wordlines in array 46. Column decoder 50 drives one of a plurality of selectors 54 coupled to the bitline pairs in array 46 to selectively drive the appropriate bitline pair based upon the decoded memory address. An array of sense amplifiers 56 is also coupled to the opposite end of the bitline pairs in array 46, and is used to receive read data from a data bus, and to output data to a data bus, also in a manner well known in the art.

Figure 1:
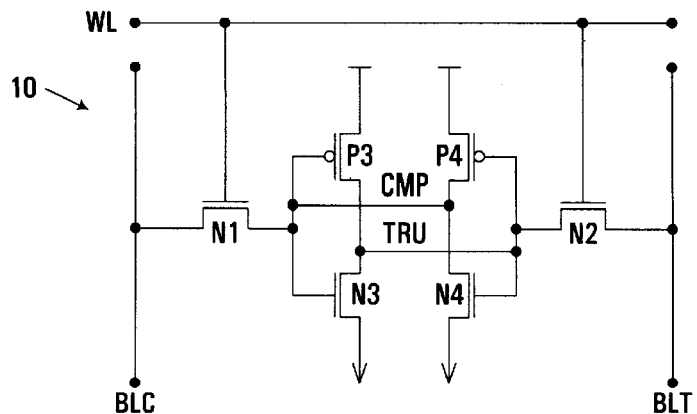
FIG. 1 is circuit diagram of a conventional static random access memory (SRAM) memory cell.
Figure 2:
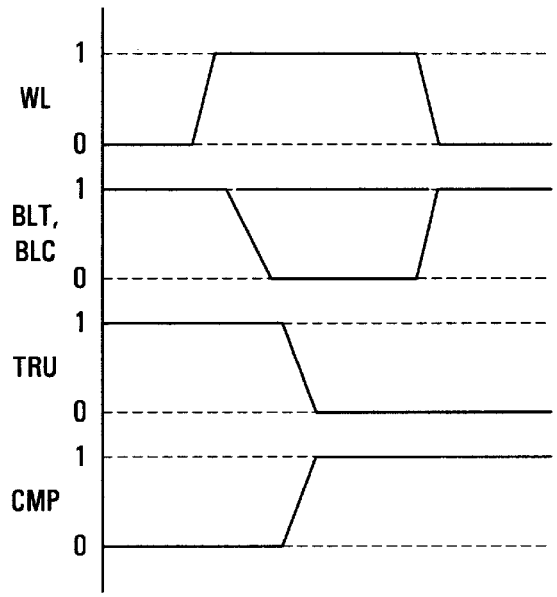
FIG. 2 is a timing diagram illustrating a write operation performed on the SRAM memory cell of FIG. 1.
Figure 3:
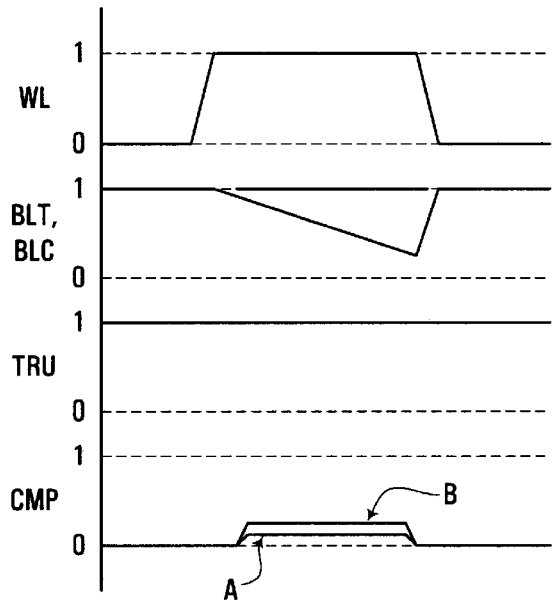
FIG. 3 is a timing diagram illustrating a read operation performed on the SRAM memory cell of FIG. 1.

Each SRAM block 42 is configured to output the appropriate wordline and bitline pair signals for array 46 to perform read and write operations on selected memory cells in the array, e.g., as discussed above in connection with FIGS. 2 and 3. It will be appreciated that the control of an SRAM memory array to perform read and write operations is well known in the art, and thus need not be discussed in greater detail herein.

Figure 7:
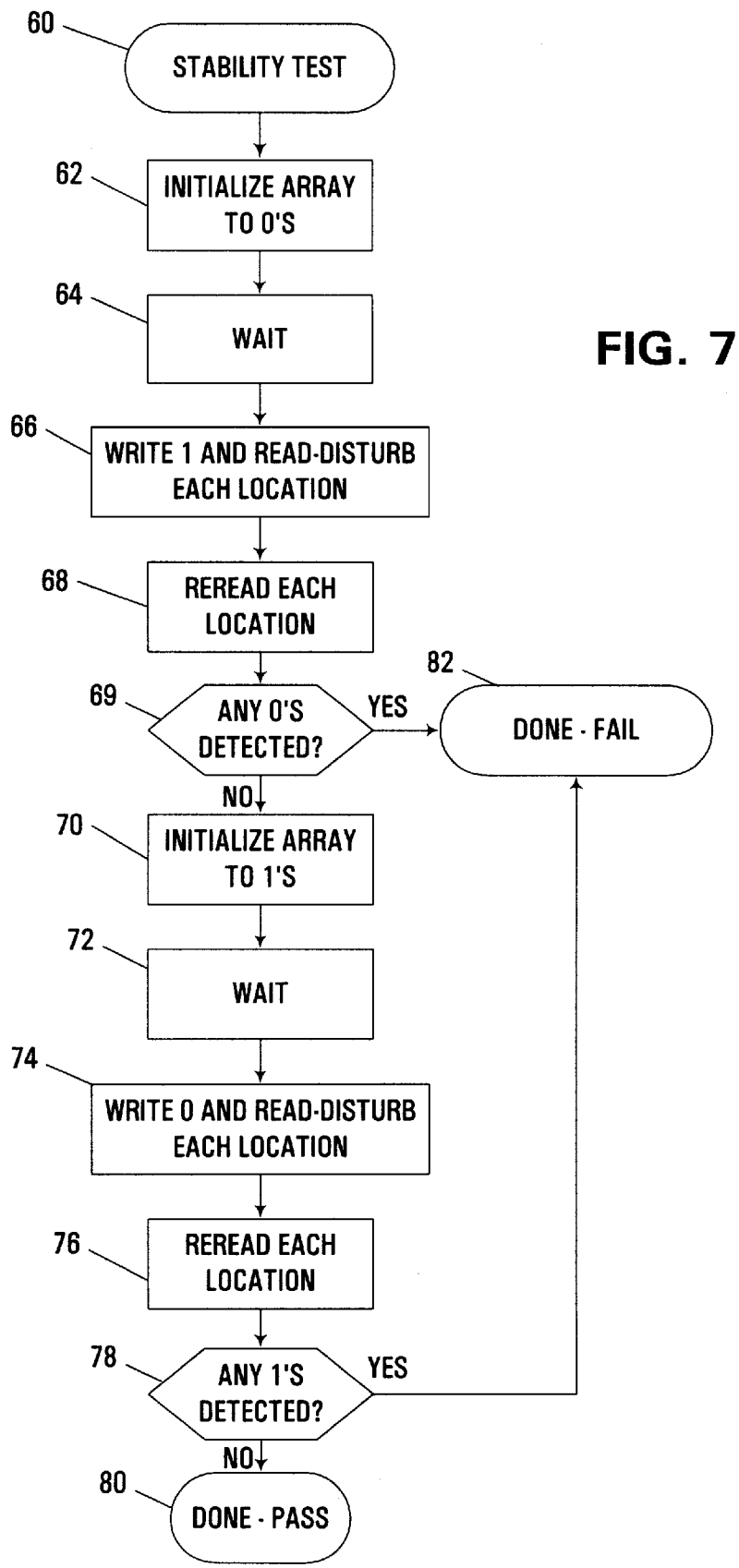
FIG. 7 is a flowchart of a stability testing algorithm performed by the embedded test logic of FIG. 5.

Returning to FIG. 5, to implement stability testing consistent with the invention, ABIST engine 44 executes a routine such as stability test routine 60 of FIG. 7. As discussed above, routine 60 may be implemented using hardwired logic within the ABIST engine, or via a software or firmware program executed by the ABIST engine.

Generally, routine 60 operates by introducing switching history effects to a memory array, and then testing the memory array by writing memory cells to their opposite states and then shortly thereafter disturbing such memory cells to stress the memory cells under worst case conditions. Then, after disturbing such memory cells, the states of such memory cells are determined by reading the contents thereof, with a test failure being indicated if any memory cell unexpectedly switches state as a result of the disturb operation.

As such, routine 60 begins in block 62 by initializing the memory array to a known state, e.g., a logic "0" state. Next, block 64 waits a time sufficient to induce adequate switching history effects.

Using the aforementioned ABIST engine 44 of the illustrated implementation, block 64 is not actually performed as a separate operation from initialization in block 62. As discussed above, ABIST engine 44 is coupled to the memory array through a serial scan chain, and thus requires several scan cycles to pass data into and out of a memory cell whenever the ABIST engine performs an operation with the memory cell. As such, initializing each memory cell in the memory array often inherently introduces sufficient delay to impose switching history effects on a memory array, so the delay may be considered to be implemented as waiting for a BIST scan operation to be completed. An advantage of such a configuration is that no additional overhead is typically added to the test.

In other embodiments, however, a timer or other counting mechanism may be required to implement block 64 to wait for a predetermined amount of time. For example, if an ABIST engine is coupled to the memory array via parallel data and address buses, no serial scan operations would be required, and thus the inherent delays associated with such operations would not be introduced during initialization. Moreover, depending upon the degree of confidence desired, the time available for performing the stability test, and the performance characteristics of the memory cells under test, the amount of time that is sufficient for inducing adequate switching history effects may vary for different applications, and thus require different amounts of delay introduced after initialization of a memory array.

Next, block 66 performs a plurality of accesses to the plurality of memory cells in the array. For each access, the opposite state (a logic "1") is written to a memory cell, and shortly thereafter, e.g., on the next memory access cycle, a disturb operation, e.g., a read to the memory cell or another memory cell on the same wordline, or any other operation that results in the pass gates of the memory cell being activated, is performed. By activating the pass gates of a memory cell as a result of a disturb operation, charge is allowed to flow from the bitline pairs to flood into the memory cell, and thereby stress the memory cell as described herein.

Once each memory cell in the array is accessed in such a manner, block 68 then rereads each memory cell to verify whether the memory cell still contains a logic "1" state. Next, block 69 determines whether any logic "0" states were detected, indicating that an unstable memory cell was encountered.

If not, control passes to blocks 70–74, which perform a second pass through the memory array, this time initializing the array to all logic "1"'s, waiting for switching history effects to be introduced, accessing the array to set each memory cell to a logic "0" state and immediately thereafter disturbing the cell. Next, block 76 rereads each memory cell in the array to determine whether any memory cell has switched state back to the logic "1" state, and block 78 determines whether any logic "1" states were detected.

If not, the stability test has been passed, and control passes to block 80 to terminate routine 60 with a "pass" indication. However, if either block 69 or block 78 detects that a memory cell has switched state, control passes to block 82 to terminate routine 60 with a "fail" indication. Stability testing is then complete.

It should be noted that any delay may be present between a disturb operation and a reread operation on a memory cell, as it is the disturb operation that will induce, if at all, the memory cell to switch back to its favored state. As such, an alternative implementation may be to reread each memory cell immediately after it is disturbed.

It is also to be noted that stability testing may be performed at the rated operational speed of a memory array, or at some lower speed. Moreover, the time between switching the state of a memory cell and performing a disturb operation on the memory cell may vary, e.g., by inserting one or more memory access cycles between the same. However, typically the less delay between switching the state of a memory cell and performing a disturb operation on the cell, the greater the stress applied to the memory cell, and hence the greater the chance of detecting an unstable memory cell.

As an example, in one exemplary embodiment where an embedded SRAM memory array is implemented using multiple (e.g., up to 48) 2 k×72 SRAM blocks rated at 500–700 MHZ, and with a scan chain requiring at least 135 scan cycles defined in each SRAM block, stability testing may be performed at 500 MHZ, thereby providing a delay between initializing the memory array and performing the access operations of about 276 microseconds, a delay of about 2 nanoseconds between each state switch operation and disturb operation, and an overall test time (for two passes) of about 1.7 milliseconds.

It will also be appreciated that the procedures described herein may be used to test individual memory cells, all the memory cells in an array, or only a portion of the memory cells in an array. In addition, any number of sequences may be used to control the order in which memory addresses are accessed in an array during a test. Furthermore, all of the memory cells in an array may be initialized to the same state, or different initial states may be used for different memory cells.

Other modifications will be apparent to one of ordinary skill in the art. Therefore, the invention lies in the claims hereinafter appended.

What is claimed is:

1. A method of testing a silicon-on-insulator (SOI) static random access memory (SRAM), the method comprising:
   (a) introducing switching history effects to an SOI SRAM memory cell by maintaining the memory cell in a first state for a period of time;
   (b) setting the memory cell to a second state after introducing the switching history effects;
   (c) disturbing the memory cell after setting the memory cell to the second state; and
   (d) determining the current state of the memory cell after disturbing the memory cell to confirm whether the memory cell is still in the second state.

2. The method of claim 1, further comprising indicating a test failure in response to determining that the current state of the memory cell is not the second state.

3. The method of claim 1, wherein maintaining the memory cell in the first state for the period of time includes:
   (a) initializing the memory cell to the first state; and
   (b) waiting a predetermined amount of time between initializing the memory cell to the first state and setting the memory cell to the second state.

4. The method of claim 3, wherein waiting the predetermined amount of time includes waiting until completion of a BIST scan operation.

5. The method of claim 3, wherein the memory cell is a first memory cell in an array of memory cells, and wherein initializing the memory cell to the first state includes initializing each memory cell in the array of memory cells to the first state, and wherein setting the memory cell to the second state and disturbing the memory cell are performed for each memory cell in the array.

6. The method of claim 5, wherein setting the memory cell to the second state and disturbing the memory cell are performed on successive memory access cycles.

7. The method of claim 1, further comprising, after determining the current state of the memory cell:
   (a) initializing the memory cell to the second state;
   (b) waiting a predetermined amount of time after initializing the memory cell to the second state;
   (c) setting the memory cell to the first state after waiting the predetermined amount of time;
   (d) disturbing the memory cell after setting the memory cell to the first state; and (e) determining the current state of the memory cell after disturbing the memory cell after setting the memory cell to the first state to confirm whether the memory cell is still in the first state.

8. The method of claim 1, wherein disturbing the memory cell includes reading the memory cell.

9. The method of claim 1, wherein the memory cell includes a pair of pass gates respectively coupled to a pair of bitlines and activated by a wordline, wherein disturbing the memory cell includes activating the pair of pass gates by asserting the wordline.

10. The method of claim 1, wherein determining the current state of the memory cell includes reading the memory cell.

11. The method of claim 1, wherein introducing the switching history effects, setting the memory cell to the second state, disturbing the memory cell, and determining the current state of the memory cell are performed by a built-in self-test (BIST) engine disposed on the same integrated circuit device as the memory cell.

12. The method of claim 1, wherein introducing the switching history effects, setting the memory cell to the second state, disturbing the memory cell, and determining the current state of the memory cell are performed by a memory tester disposed external to an integrated circuit device upon which the memory cell is disposed.

13. A method of testing a silicon-on-insulator (SOI) static random access memory (SRAM), the method comprising:
(a) initializing each of a plurality of memory cells in a memory array to a first state;
(b) accessing the plurality of memory cells in a predetermined sequence, including, for each memory cell:
(i) setting the memory cell to a second, opposite state for that memory cell; and
(ii) disturbing the memory cell after setting the memory cell to the second state; and
(c) after accessing the plurality of memory cells, determining the current state of each memory cell to confirm whether the memory cell is still in the second state for that memory cell.

14. The method of claim 13, further comprising maintaining each of the plurality of memory cells in the first state for a period of time between initializing each of the plurality of memory cells and accessing the plurality of memory cells to allow switching history effects to be introduced to each memory cell.

15. The method of claim 14, wherein maintaining each of the plurality of memory cells in the first state includes waiting until completion of a BIST scan operation.

16. The method of claim 13, further comprising indicating a test failure in response to determining that the current state of any of the plurality of memory cells is not the second state for such memory cell.

17. The method of claim 13, wherein disturbing the memory cell includes disturbing the memory cell on the next memory access cycle after setting the memory cell to the second state for that memory cell.

18. The method of claim 13, further comprising, after determining the current state of each memory cell:
(a) initializing each of the plurality of memory cells in a memory array to the second state for such memory cell;
(b) accessing the plurality of memory cells in a second predetermined sequence, including, for each memory cell:
(i) setting the memory cell to the first state for that memory cell; and
(ii) disturbing the memory cell after setting the memory cell to the first state; and
(c) after accessing the plurality of memory cells in the second predetermined sequence, determining the current state of each memory cell to confirm whether the memory cell is still in the first state for that memory cell.

19. The method of claim 13, wherein disturbing the memory cell includes reading the memory cell.

20. The method of claim 13, wherein each memory cell includes a pair of pass gates respectively coupled to a pair of bitlines and activated by a wordline, wherein disturbing the memory cell includes activating the pair of pass gates by asserting the wordline.

21. The method of claim 13, wherein initializing each of a plurality of memory cells in a memory array to a first state includes initializing each of the plurality of memory cells to the same state.

22. A method of testing a silicon-on-insulator (SOI) static random access memory (SRAM), the method comprising:
(a) initializing each memory cell in a memory array to a zero logic state;
(b) after initializing each memory cell to the zero logic state, waiting for completion of a first BIST scan operation;
(c) accessing each memory cell in the memory array a first time by sequentially setting each memory cell to a one logic state and in an immediately subsequent memory access cycle reading the memory cell;
(d) after accessing each memory cell in the memory array the first time, determining the current state of each memory cell a first time to confirm whether the memory cell is still in the one logic state;
(e) after determining the current state of each memory cell the first time, initializing each memory cell in the memory array to a one logic state;
(f) after initializing each memory cell to the one logic state, waiting for completion of a second BIST scan operation;
(g) accessing each memory cell in the memory array a second time by sequentially setting each memory cell to the zero logic state and in an immediately subsequent memory access cycle reading the memory cell;
(h) after accessing each memory cell in the memory array the second time, determining the current state of each memory cell a second time to confirm whether the memory cell is still in the zero logic state; and
(i) indicating a test fail if, during determining the current state of each memory cell the first time, any memory cell is determined to be in the zero logic state, or if, during determining the current state of each memory cell the second time, any memory cell is determined to be in the one logic state.

23. An apparatus, comprising:
(a) a memory array including a silicon-on-insulator (SOI) static random access memory (SRAM) memory cell; and
(b) test logic coupled to the memory array, the test logic configured to introduce switching history effects to the memory cell by maintaining the memory cell in a first state for a period of time, set the memory cell to a second state after introducing the switching history effects, disturb the memory cell after setting the memory cell to the second state, and determine the current state of the memory cell after disturbing the memory cell to confirm whether the memory cell is still in the second state.

24. The apparatus of claim 23, the memory array and the test logic are disposed on an integrated circuit device.

25. The apparatus of claim 24, wherein the test logic comprises a built in self test (BIST) engine.

26. The apparatus of claim 23, wherein the memory array is disposed on an integrated circuit device, and wherein the test logic is disposed in an external test circuit electrically coupled to the integrated circuit device.

27. A program product, comprising:
(a) a program configured to test a silicon-on-insulator (SOI) static random access memory (SRAM) memory cell, the program further configured to introduce switching history effects to the memory cell by maintaining the memory cell in a first state for a period of time, set the memory cell to a second state after introducing the switching history effects, disturb the memory cell after setting the memory cell to the second state, and determine the current state of the memory cell after disturbing the memory cell to confirm whether the memory cell is still in the second state; and
(b) a signal bearing medium bearing the program.

28. The program product of claim 27, wherein the signal bearing medium includes at least one of a recordable medium and a transmission medium.

29. The program product of claim 27, wherein the program defines a built in self test circuit configured to be fabricated on an integrated circuit device along with the memory cell.

30. The program product of claim 27, wherein the program is configured to be executed by an external test circuit configured to be electrically coupled to an integrated circuit device upon which the memory cell is disposed.

* * * * *